United States Patent
Wu et al.

(10) Patent No.: US 8,753,976 B1
(45) Date of Patent: *Jun. 17, 2014

(54) METHODS AND APPARATUS FOR ETCHING PHOTO-RESIST MATERIAL THROUGH MULTIPLE EXPOSURES OF THE PHOTO-RESIST MATERIAL

(71) Applicant: Marvell International Ltd., Hamilton (BM)

(72) Inventors: Albert Wu, Palo Alto, CA (US); Chien-Chuan Wei, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,561

(22) Filed: Jul. 29, 2013

Related U.S. Application Data

(63) Continuation of application No. 13/212,065, filed on Aug. 17, 2011, now Pat. No. 8,501,619, which is a continuation of application No. 12/767,626, filed on Apr. 26, 2010, now Pat. No. 8,003,523, which is a continuation of application No. 12/024,784, filed on Feb. 1, 2008, now Pat. No. 7,704,875.

(60) Provisional application No. 60/908,022, filed on Mar. 26, 2007, provisional application No. 60/888,134, filed on Feb. 5, 2007.

(51) Int. Cl.
*H01L 21/47* (2006.01)

(52) U.S. Cl.
USPC ..... 438/637; 438/675; 438/725; 257/E21.027

(58) Field of Classification Search
USPC .......................... 438/946, 947; 257/E21.023
See application file for complete search history.

(56) References Cited

U.S. PATENT DOCUMENTS

| | | | |
|---|---|---|---|
| 6,251,745 B1 | 6/2001 | Yu | |
| 7,001,712 B2 | 2/2006 | Imai et al. | |
| 7,704,875 B1 * | 4/2010 | Wu et al. | 438/637 |
| 8,501,619 B1 * | 8/2013 | Wu et al. | 438/637 |
| 2004/0110095 A1 | 6/2004 | Imai et al. | |

* cited by examiner

*Primary Examiner* — Stephen W Smoot

(57) ABSTRACT

A method including: forming a dielectric layer over a substrate of a microelectronic device; forming a photoresist layer over the dielectric layer; performing a first exposure of the photoresist layer to permit portions of the dielectric layer to be removed at a first plurality of locations; subsequent to performing the first exposure, performing a second exposure of the photoresist layer to permit portions of the dielectric layer to be removed at a second plurality of locations different from the first plurality of locations; removing the portions of the dielectric layer at each of i) the first plurality of locations and ii) the second plurality of locations; and etching the dielectric layer at each of i) the first plurality of locations and ii) the second plurality of locations to respectively form a contact hole at each of the i) the first plurality of locations and ii) the second plurality of locations.

20 Claims, 7 Drawing Sheets

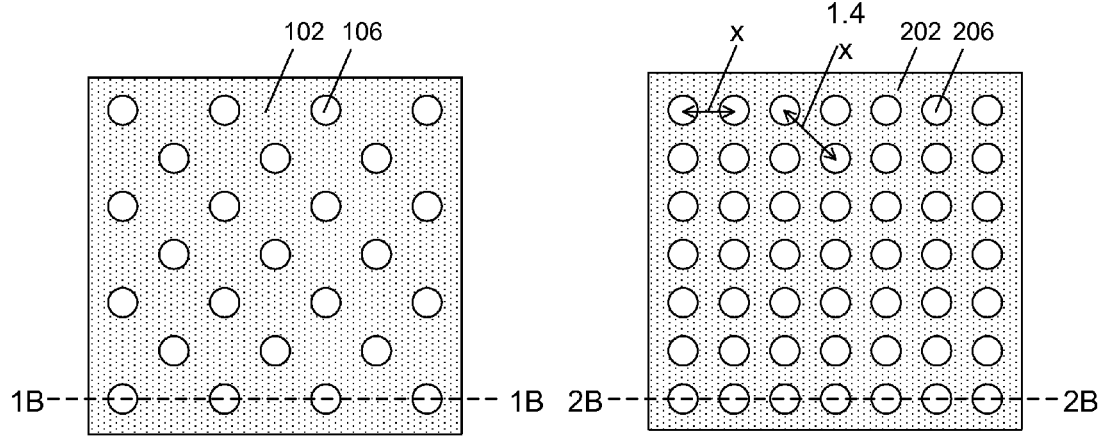
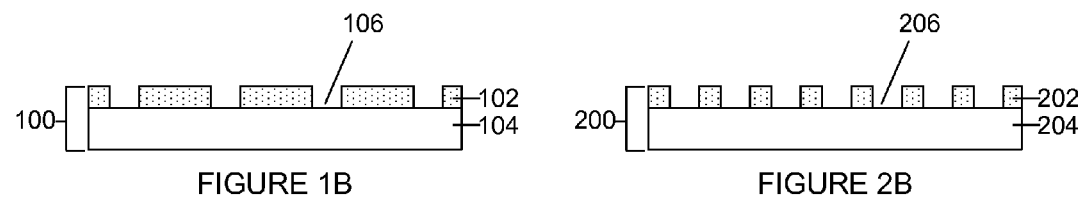

METHODS AND APPARATUS FOR ETCHING PHOTO-RESIST MATERIAL THROUGH MULTIPLE EXPOSURES OF THE PHOTO-RESIST MATERIAL

CROSS-REFERENCE TO RELATED APPLICATIONS

The present disclosure is a continuation of and claims priority to U.S. patent application Ser. No. 13/212,065, filed Aug. 17, 2011, now U.S. Pat. No. 8,501,619, issued Aug. 6, 2013, which is a continuation of U.S. patent application Ser. No. 12/767,626, filed Apr. 26, 2010, now U.S. Pat. No. 8,003,523, issued Aug. 23, 2011, which is a continuation of U.S. patent application Ser. No. 12/024,784, filed Feb. 1, 2008, now U.S. Pat. No. 7,704,875, issued Apr. 27, 2010, which claims priority to U.S. Provisional Patent Application Nos. 60/908,022, filed Mar. 26, 2007, and 60/888,134, filed Feb. 5, 2007, which are incorporated herein by reference.

TECHNICAL FIELD

Embodiments of the present invention relate to the field of microelectronic devices, in particular, to contacts and contact holes for microelectronic devices.

BACKGROUND

The demand for increasingly smaller devices has posed a number of challenges at least in terms of manufacturing, particular to the various photolithographic operations generally needed for patterning intricate features. Forming high-density contact holes, for example, may be limited by the optical resolution capabilities of photolithographic exposure tools. Although there exist advanced photolithography tools that employ reduced wavelengths and have high numerical aperture values, these factors may still be insufficient to effect onto a photoresist layer the required exposure for producing the desired contact hole density and/or size. Accordingly, effectively patterning high-density and high aspect ratio contact holes is of substantial importance.

SUMMARY OF THE INVENTION

In view of the problems in the state of the art, embodiments of the invention are directed to methods for forming high-density contact holes and contacts. More specifically, with the foregoing and other items in view, there is provided, in accordance with various embodiments of the invention, a method comprising depositing a photoresist material over a dielectric layer; patterning the photoresist material to reveal first portions of the dielectric layer at a first plurality of locations; patterning the photoresist material to reveal second portions of the dielectric layer at a second plurality of locations; and etching the revealed first and second portions of the dielectric layer to form corresponding first and second pluralities of contact holes.

In various embodiments, patterning the photoresist material to reveal the first portions may comprise exposing the photoresist material using a first mask configured to pattern the first plurality of locations. Patterning the photoresist material to reveal the second portions may comprise exposing the photoresist material using a second mask configured to pattern the second plurality of locations. In some embodiments, patterning the photoresist material to reveal the second portions may comprise re-positioning the first mask over the photoresist material for patterning the second plurality of locations.

In some embodiments, the method may comprise depositing a photoresist material into the first plurality of contact holes, wherein the photoresist material is patterned to reveal the second portions after said depositing the photoresist material into the first plurality of contact holes.

In various embodiments, etching the revealed first portions and said etching the revealed second portions may be performed substantially simultaneously.

In various embodiments, the first plurality of contact holes may have a first contact pitch, the second plurality of contact holes may have a second contact pitch, and the first and second plurality of contact holes together may have a third contact pitch, the third contact pitch being less than the first contact pitch and the second contact pitch.

In some embodiments, the method may comprise forming the dielectric layer over a substrate, wherein the substrate is a memory device including a plurality of memory cells. In various embodiments, the first and second plurality of contact holes may be formed over the memory cells. In various embodiments, a metal may be deposited in the first and second plurality of contact holes to form corresponding first and second pluralities of contacts.

There is also provided, in accordance with various embodiments, a method comprising depositing a first dummy layer over a substrate to form a first pattern; depositing a second dummy layer over the substrate to form a second pattern, the second pattern overlapping the first pattern at a plurality of locations; etching the first and second dummy layers to form a plurality of posts at the plurality of locations; forming a dielectric layer over the substrate; and etching the posts to form a plurality of contact holes in the dielectric layer.

In various embodiments, the first pattern may comprise a plurality of lines of the first dummy layer, and the second pattern may comprise a plurality of lines of the second dummy layer.

In various embodiments, forming the dielectric layer may comprise forming the dielectric layer over the substrate and at least one of the posts, and the method may further comprise removing a portion of the dielectric layer to expose a top surface of the at least one post. In various embodiments, removing the portion of the dielectric layer may comprise chemically and mechanically planarizing the portion of the dielectric layer.

In some embodiments, the first and the second dummy layers may comprise polysilicon.

In various embodiments, the substrate may comprise a memory device including a plurality of memory cells, and the plurality of contact holes may be formed over the memory cells. In some embodiments, a metal may be deposited in the first and second plurality of contact holes to form corresponding first and second pluralities of contacts.

There is also provided, in accordance with various embodiments, a method comprising exposing a first pattern of a photoresist material to a first energy, the first energy being less than an activation energy dose required to develop the photoresist material; exposing a second pattern of the photoresist material to a second energy, the second pattern overlapping the first pattern at a plurality of locations, and the second energy being less than the activation energy dose; removing the photoresist material at the plurality of locations to reveal portions of a dielectric layer; and etching the revealed portions of the dielectric layer to form a plurality of contact holes.

In various embodiments, the first energy combined with the second energy may have a total energy equal to or greater than the activation energy dose. In some embodiments, the first energy and the second energy may each be substantially half of the activation energy dose.

In various embodiments, exposing the first pattern may comprise exposing the photoresist material using a first mask configured to form the first pattern. In some embodiments, exposing the second pattern may comprise exposing the photoresist material using a second mask configured to form the second pattern. In some embodiments, exposing the second pattern may comprise re-positioning the first mask over the photoresist material for exposing the second pattern.

In various embodiments, the method may comprise forming the dielectric layer over a substrate, wherein the substrate is a memory device including a plurality of memory cells. In various embodiments, the plurality of contact holes may be formed over the memory cells. In some embodiments, metal may be deposited into the plurality of contact holes to form corresponding plurality of contacts.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 1A illustrates a top view of a microelectronic device including a plurality of contact holes, and FIG. 1B illustrates a cross-sectional side view of the microelectronic device of FIG. 1A.

FIG. 2A illustrates a top view of a microelectronic device including a plurality of contact holes having a reduced contact pitch relative to the microelectronic device of FIGS. 1A-1B, and FIG. 2B illustrates a cross-sectional side view of the microelectronic device of FIG. 2A.

DETAILED DESCRIPTION OF EMBODIMENTS OF THE INVENTION

Figure 3A:
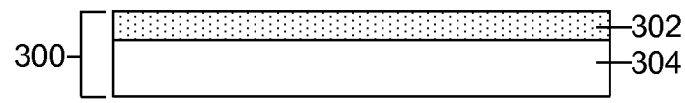
FIGS. 3A-3F illustrate various stages of a method for forming high-density contact holes in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to methods for patterning high-density contact holes. Illustrated in FIG. 1A is a microelectronic device 100 including a dielectric layer 102 formed over a substrate 104. Typically, one or more other device layers may be disposed between dielectric layer 102 and substrate 104. For clarity, however, dielectric layer 102 is illustrated as being directly on substrate 104.

A number of contact holes 106 are formed in dielectric layer 102. Contact holes 106 may have a pre-determined pitch between contact holes 106. As illustrated in FIG. 2A, however, microelectronic device 200 includes a higher density of contact holes 206, having a reduced pitch between contact holes 206. Microelectronic device 200 includes, like microelectronic device 100, a dielectric layer 202 formed over a substrate 204. Rather than controlling various parameters of a photolithographic exposure tool for achieving the increased contact hole density, an exemplary method comprising patterning first portions of dielectric layer (e.g., contact holes 106 of FIG. 1A-1B) and second portions of dielectric layer (e.g., the additional contact holes 206 of FIG. 2A-2B) in at least two operations, wherein the contact pitch achieved may be one that a photolithographic exposure tool may be optically incapable of resolving.

Illustrated in FIGS. 3A-3F are cross-sectional views of a microelectronic device 300 after various operations associated with forming high-density contact holes. In various embodiments and as illustrated at FIG. 3A, a dielectric layer 302 may be formed over a substrate 304. Substrate 304 used for various embodiments of the present invention may be any suitable substrate including, for example, silicon, germanium, gallium arsenide, and the like. Likewise, dielectric layer 302 for various embodiments described herein may be formed with any dielectric material suitable for the purpose including, for example, oxide, polyimide, or the like. In some embodiments, dielectric layer 302 may be an interlayer dielectric layer. It is noted that although dielectric layer 302 is illustrated being formed directly on substrate 304, one or more device layers may intervene substrate 304 and dielectric layer 302, depending on the application.

Figure 3B:
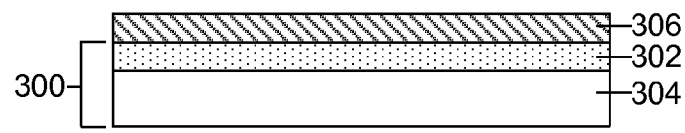

As illustrated in FIG. 3B, a photoresist layer 306 may be formed over the dielectric layer 302. A photoresist material suitable for forming photoresist layer 306 may be any radiation-sensitive material suitable for the purpose. Photoresist layer 306 may be formed from a positive photoresist or a negative photoresist, depending on the application, and embodiments of the present invention are applicable to both. For the various embodiments described herein, positive photoresists are illustrated for simplicity.

Figure 3C:
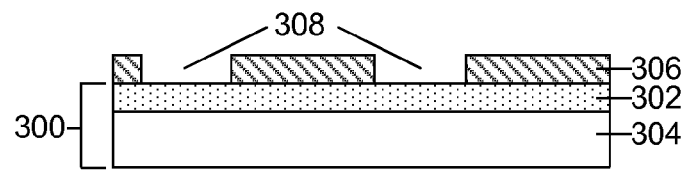

Photoresist layer 306 may be patterned with a first pattern to reveal first portions 308 of dielectric layer 302 at a first plurality of locations, as illustrated at FIG. 3C. The first revealed portions 308 may correspond to locations of contact holes 106 illustrated in FIGS. 1A-1B, and having a first contact pitch.

According to various embodiments, patterning photoresist layer 306 to reveal first portions 308 may comprise exposing the photoresist layer 306 using a first mask (not illustrated) configured to pattern the first plurality of locations. A mask used for any one or more of various operations described herein may be any suitable patterning apparatus such as, for example, a reticle. Photoresist materials used for forming photoresist layers for any one or more of various operations described herein may be exposed to any radiation, and for any amount of time, suitable to cause the photoresist material to be removable, at the exposed locations (or unexposed locations with negative photoresist), during a develop operation.

Patterning photoresist layer 306 may include one or more development operations for removing the exposed locations of photoresist layer 306 (or unexposed locations for negative photoresist).

Figure 3D:
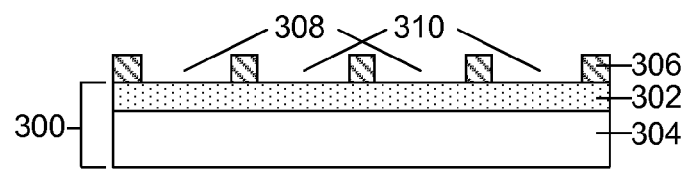

As illustrated in FIG. 3D, photoresist layer 306 may be patterned with a second pattern to reveal second portions 310 of dielectric layer 302 at a second plurality of locations. The second revealed portions 310 may correspond to locations of the additional contact holes 206 illustrated in FIGS. 2A-2B, and having a second contact pitch.

According to various embodiments, patterning photoresist layer 306 to reveal second portions 310 may comprise exposing photoresist layer 306 using a second mask (not illustrated) configured to pattern the second plurality of locations. In various other embodiments, the first mask used for forming the first pattern may be re-used for forming the second pattern by re-positioning the first mask over the photoresist layer 306, by moving the first mask or the substrate, to a position suitable for patterning the second pattern. One or more development operations may be performed for removing the exposed locations of photoresist layer 306.

Although FIGS. 3C and 3D depict separate patterning operations, with first portions 308 of dielectric layer 302 being revealed first and second portions 310 of dielectric layer 302 being revealed second, various ones of the operations may be performed in another order or may be combined into fewer operations. For example, photoresist layer 306 may be exposed with the first pattern, then exposed with the second pattern, and then may be developed by simultaneously removing the exposed locations.

Figure 3E:
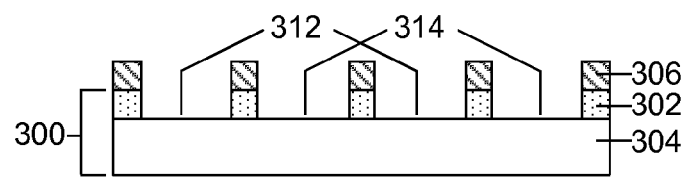
Figure 3F:
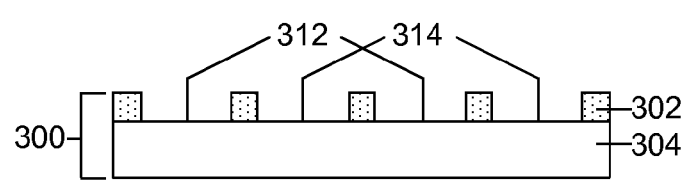

As illustrated in FIG. 3E, revealed first and second portions 308, 310 of dielectric layer 302 may be etched to form corresponding first and second pluralities of contact holes 312, 314. The revealed first and second portions 308, 310 may be etched in separate operations or may be performed substantially simultaneously. For example, revealed first portions 308 may be etched after patterning the first pattern and prior to patterning the second pattern, or alternatively, revealed first and second portions 308, 310 may be etched substantially simultaneously after patterning both first and second patterns.

In some embodiments, revealed first portions 308 may be etched to form first contact holes 312, and prior to revealing second portions 310, photoresist material may be formed into at least the first contact holes 312. The second portions 310 of dielectric layer 302 may then be revealed and the revealed second portions 310 etched to form second contact holes 314.

As noted herein, first contact holes 312 may have a first contact pitch and second contact holes 314 may have a second pitch. According to various embodiments, the first and second pluralities of contact holes 312, 314 together may have a third contact pitch. The first pitch and the second pitch are both greater than the third pitch, thus allowing for a contact pitch greater that that which may be permitted with certain photolithographic tools. Referring back to FIG. 2A, for example, contact holes are formed having a contact pitch of x, yet those contact holes were formed by twice patterning contact holes having a contact pitch of 1.4× (i.e., $\sqrt{x^2+x^2}$). Accordingly, a photolithographic exposure tool need only be capable of optically resolving a pattern for forming a contact pitch of 1.4×, yet may still form contact holes having a reduced contact pitch of x.

In various embodiments, high-density contact holes may be formed by using dummy layers in contrast to the multi-step exposure approach discussed above. In contrast to depending on the optical resolution capabilities of photolithographic exposure tools, this embodiment allows for forming contact holes having a contact pitch limited only by the size and/or spacing of dummy layer patterns. In various ones of these embodiments, intersecting locations of the dummy layers are the locations of later-formed contact holes. Accordingly, high-density contact holes may be possible regardless of the photolithographic exposure capabilities.

Figure 4A:
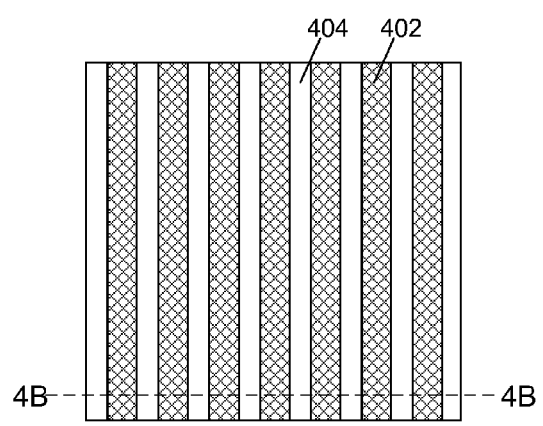
FIGS. 4A-4I illustrate various stages of another method for forming high-density contact holes in accordance with various embodiments of the present invention.

FIGS. 4A-4I illustrate various views of a microelectronic device 400 after various operations associated with forming high-density contact holes using dummy layers. As illustrated in FIG. 4A (top view) and FIG. 4B (cross-sectional side view), a first dummy layer 402 is deposited over a substrate 404 in a first pattern. In this embodiment, the first pattern includes a number of lines, but other embodiments of the first pattern may comprise any other suitable pattern and may depend on the particular application. It should be noted that although the illustrated embodiment depicts first dummy layer 402 being formed directly on substrate 404, a microelectronic device may typically include one or more device layers disposed therebetween. The condensed illustration simplifies the structure for the sake of clarity.

Figure 4C:
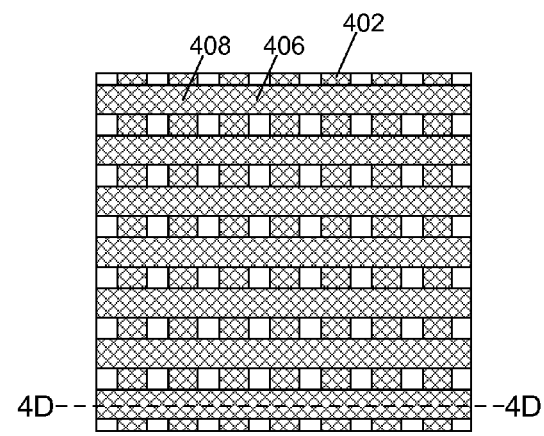
Figure 4B:
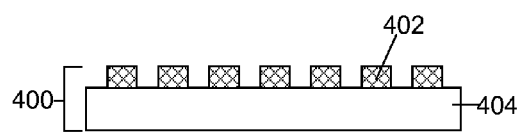
Figure 4D:
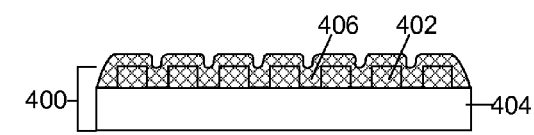

A second dummy layer 406 is formed over the substrate 404 and over some portions of first dummy layer 402, as illustrated in FIG. 4C (top view) and 4D (cross-sectional side view). In the illustrated embodiment, first dummy layer 402 is formed as a number of lines in the y-direction and the second dummy layer 406 is formed as a number of lines in the x-direction, forming a plurality of intersecting locations 408. As depicted in FIG. 4D, the intersecting locations 408 effectively include substantially a double layer of material while the non-intersecting locations include substantially a single layer of material.

The first and second dummy layers 402, 406 may be formed from any suitable material. In various embodiments, one or both of the dummy layers 402, 406 may be formed using polysilicon. Other materials may be similarly suitable. For example, silicon nitride may be used for forming dummy layers 402, 406.

Figure 4E:
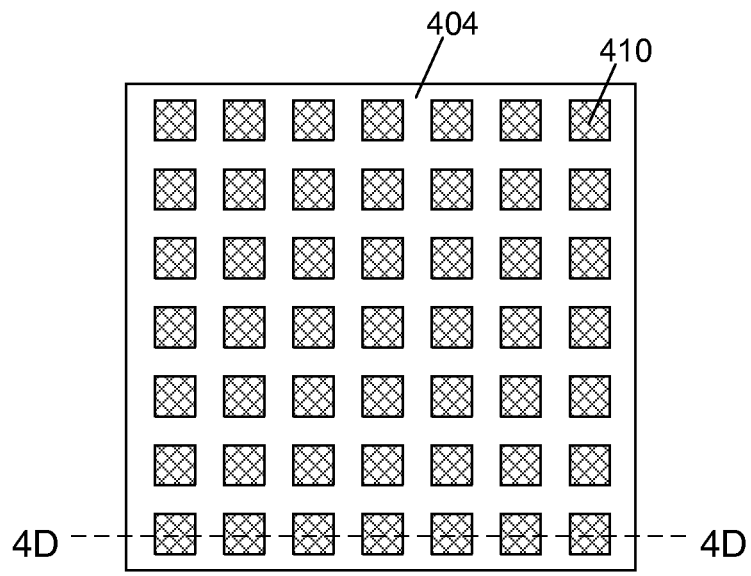
Figure 4F:
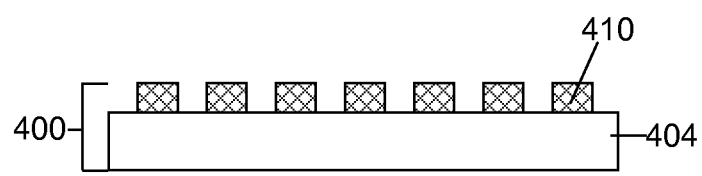

The first and second dummy layers 402, 406 may be etched to form a plurality of posts 410 at the plurality of intersecting locations 408 as illustrated in FIG. 4E (top view) and FIG. 4F (cross-sectional side view). The plurality of posts 410 should generally be disposed at locations at which a corresponding plurality of contact holes are desired because the posts will be etched, as discussed more fully below, for forming the contact holes. Accordingly, the first and second dummy layers 402, 406 may be configured to intersect at locations where contact holes are desired.

For forming the posts 410, the etch operation may be adapted to etch away a thickness of polysilicon, or whichever material is used for forming dummy layers 402, 406, equal to the thickness of either the first dummy layer 402 or the second dummy layer 406, whichever is greater. The etch operation, however, should not etch away so much polysilicon as to leave posts 410 of an insufficient height. In other words, the etch operation should be adapted to etch a thickness of polysilicon at least equal to the thicker of the dummy layers 402, 406, but no more than an amount necessary to leave posts 410 at least as tall as the desired contact holes to be later formed.

Figure 4G:
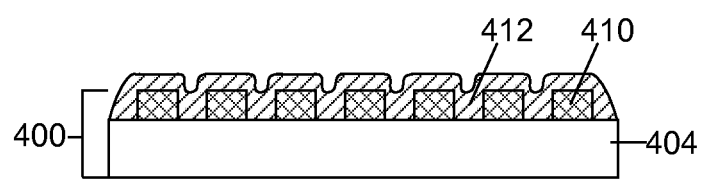
Figure 4H:
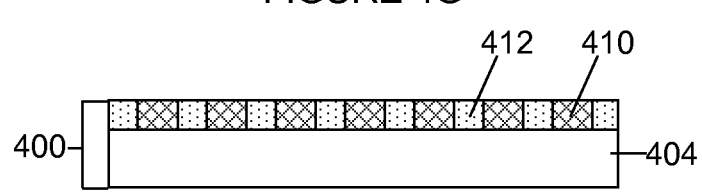

A dielectric layer 412 may be formed over the substrate 404 and posts 410 as illustrated at FIG. 4G, and at FIG. 4H, a portion of dielectric layer 412 is removed to expose a top surface of posts 410. For removing the portion of dielectric layer 412 any suitable method may be used including, for example, a chemical-mechanical planarization (CMP) operation (sometimes alternatively referred to in the art as "chemical-mechanical polish"). While removing the portion of dielectric layer 412 it may also be desirable to remove some amount of the top surface of posts 410. Doing so may ensure full removal of dielectric layer 412 and/or may produce a desired degree of levelness.

Figure 4I:
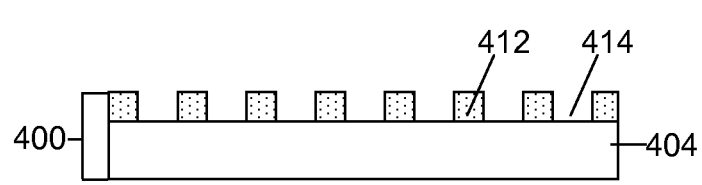

Posts 410 may be etched to form a plurality of contact holes 414 in dielectric layer 412, the plurality of contact holes 414 corresponding to the locations of posts 410 prior to their removal, as illustrated in FIG. 4I. It should be evident that using dummy layers 402, 406 for forming posts 410, and ultimately, contact holes 414 at the locations of posts 410, allows for forming contact holes 414 having a contact pitch limited only by the size and/or spacing of dummy layer patterns. Accordingly, high-density contact holes 414 may be possible regardless of photolithographic exposure capabilities.

In still further embodiments, high-density contact holes may be formed using a multi-step exposure approach, wherein a first pattern is exposed to a first energy and a second pattern is exposed to a second energy, the first and the second energy each being less than a removal energy dose required to develop the photoresist material but combined may be equal to or greater than the required removal energy dose. Similarly to the multi-step exposure approach described with reference to FIGS. 3A-3F, this exemplary method may achieve a tighter contact hole pitch than that which may be permitted by a particular photolithographic exposure tool due at least in part to the contact hole pattern being broken down into at least two separate exposures, each exposure having a contact hole pattern having an increased contact hole pitch.

Figure 5A:
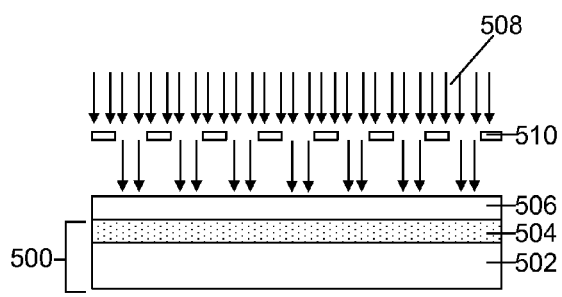
FIGS. 5A-5H illustrate various stages of another method for forming high-density contact holes in accordance with various embodiments of the present invention.

Illustrated in FIG. 5A is a cross-sectional side view of a microelectronic device 500 including a substrate 502, a dielectric layer 504 formed over substrate 502, and a photoresist material 506 formed over dielectric layer 504. As noted previously, any number of device layers may intervene substrate 502 and dielectric layer 504, and/or dielectric layer 504 and photoresist material 506, depending on the application.

A first pattern may be exposed on photoresist material 506 using a first energy 508. The first pattern may be effected by way of a mask 510 or the like. FIG. 5B illustrates a top view of microelectronic device 500 depicting for illustrative purposes the exposed first pattern 512 on photoresist material 506. Although the illustrated first pattern 512 generally comprises a number of lines in the y-direction, any suitable pattern may be employed, depending on the application.

First energy 508 may be an energy less than that required to develop photoresist material (hereinafter "activation energy dose"). The activation energy dose may be the amount of energy that must be provided to photoresist material 506 to invoke a chemical change sufficient to allow photoresist material 506 to either be removed (positive photoresist) or to become resistant to removal (negative photoresist) during development.

Figure 5C:
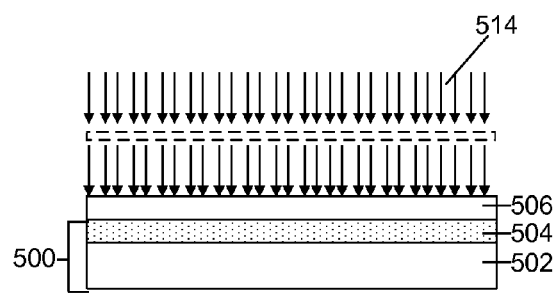
Figure 5B:
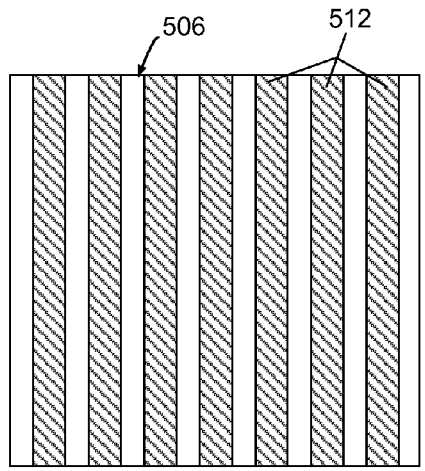
Figure 5D:
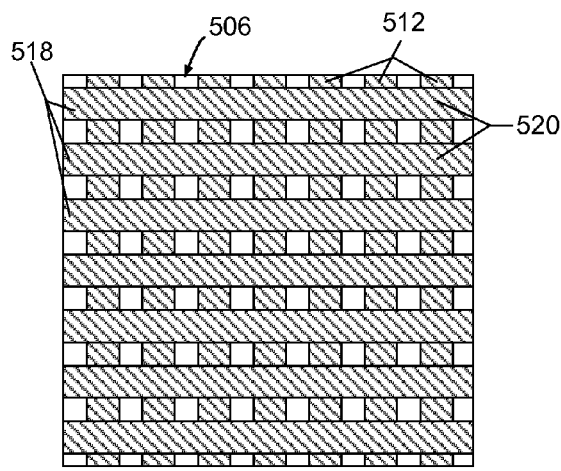

Turning now to FIG. 5C, illustrated is a cross-sectional side view of microelectronic device 500, wherein a second pattern is exposed on photoresist material 506 using a second energy 514. The second pattern may be effected by way of a mask 516 (illustrated by hatched lines) or the like. FIG. 5D illustrates a top view of microelectronic device 500 depicting for illustrative purposes the exposed second pattern 518 on photoresist material 506. Although the illustrated second pattern 518 generally comprises a number of lines in the x-direction, any suitable pattern may be employed, depending on the application, so long as first pattern 512 and second pattern 518 intersect at one or more locations 520, as explained more fully below.

In various embodiments, mask 510 used for forming first pattern 512 may be re-used for forming second pattern 518 by re-positioning mask 510 over photoresist layer 506, by moving mask 510 or the substrate 502, to a position suitable for patterning second pattern 518.

Like first energy 508, second energy 514 may be an energy value less than the activation energy dose. Accordingly, those areas of photoresist material 506 receiving less than the activation energy dose may not be expected to be removed during a development operation, wherein a developer solution is usually applied to photoresist material 506 resulting in a pattern.

Figure 5E:
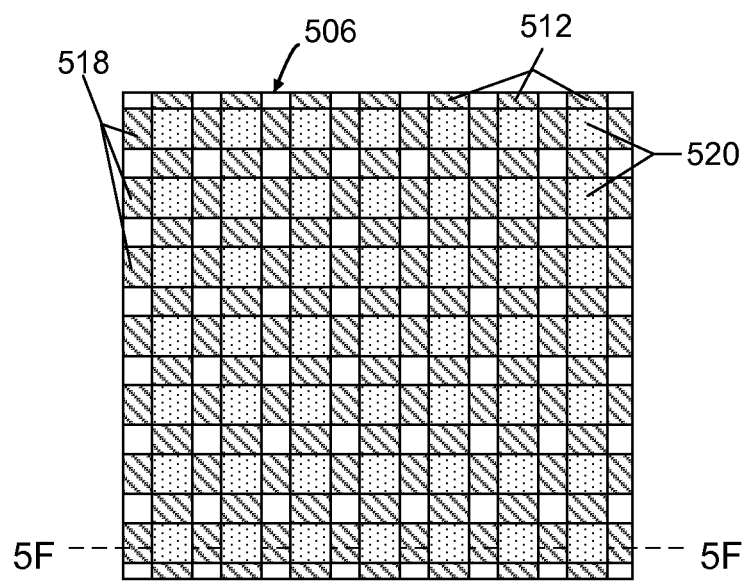
Figure 5F:
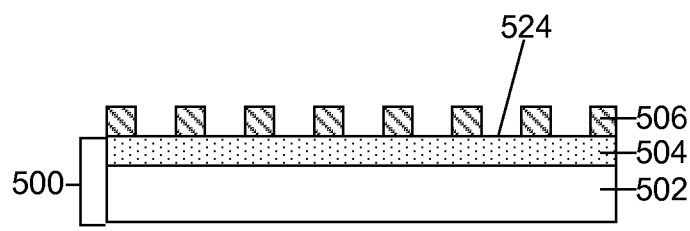

At intersecting locations 520 (see FIG. 5D), however, energy has been applied thereto, that is substantially equal to first energy 508 plus second energy 514. If the energy value of first energy 508 combined with second energy 514 is at least equal to the activation energy dose, it would be expected, then, that those intersecting locations 520 of photoresist material 506 would be removed during a development operation. For example, if first energy 508 and second energy 514 are substantially half the value of the activation energy dose, or some other combination of values equal to or exceeding the activation energy dose, then combined they would be sufficient to achieve the activation energy dose. FIG. 5E (top view) and FIG. 5F (cross-sectional side view) illustrate photoresist material 506 having been removed for the intersecting locations 520, yet remaining in non-intersecting locations 522. As illustrated, portions 524 of dielectric layer 504 are revealed after removal of photoresist material 506

In various embodiments, photoresist material 506 may be exposed to more than first pattern of first energy and second pattern of second energy. For example, a third pattern may be exposed on photoresist material 506 using a third energy, and so on. In these embodiments, the energy values of first energy 508, second energy 514, third energy, and so on, would need to be adjusted to provide the desired level of energy at intersecting locations 520 in order to achieve the activation energy dose thereat.

Figure 5G:
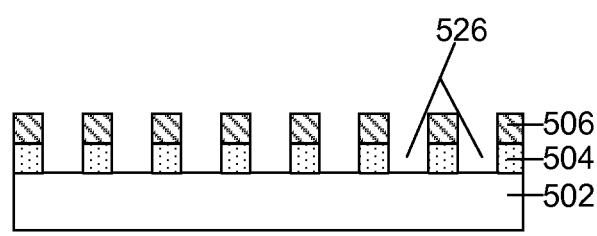
Figure 5H:
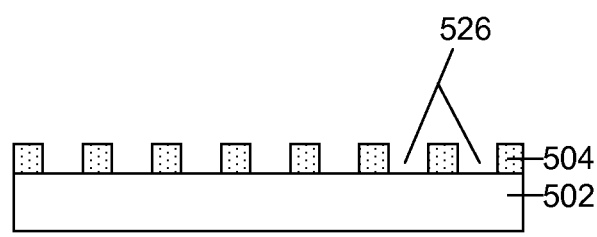

As illustrated at FIG. 5G, revealed portions 524 of dielectric layer 504 may be etched to form corresponding contact holes 526. Using the multi-step exposure approach may allow for formation of high-density contact holes having a contact hole pitch limited only by the design of the exposed patterns and perhaps the number of exposures. Accordingly, high-density contact holes may be possible regardless of photolithographic exposure capabilities.

In various embodiments, the formed contact holes may be used for forming metal contacts for electrically interconnecting various device layers of a microelectronic device. Accordingly, high-density contacts may be formed.

High-density contacts may be particularly useful for memory applications. Memory cells are generally formed in dense arrays and thus may also require contacts formed with a density difficult to achieve with various other methods.

Figure 6A:
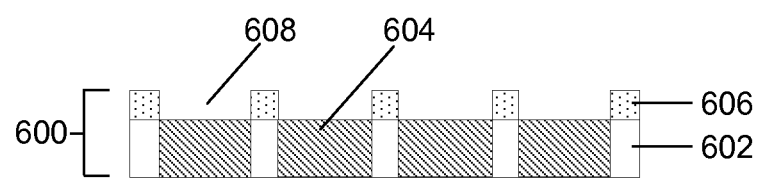
FIGS. 6A and 6B illustrate various stages of a method for forming high-density contacts in accordance with various embodiments of the present invention.

An exemplary microelectronic device 600 is illustrated in FIG. 6A. Microelectronic device 600 includes a substrate 602 having a number of memory cells 604. As illustrated, a dielectric layer 606 has been formed over substrate 602, and high-density contact holes 608 have been formed in dielectric layer 606 over memory cells 604. One or more device layers may be included between substrate 602 and dielectric layer 606, depending on the application. Any one or more various methods as described herein may be used for forming contact holes 608.

Figure 6B:
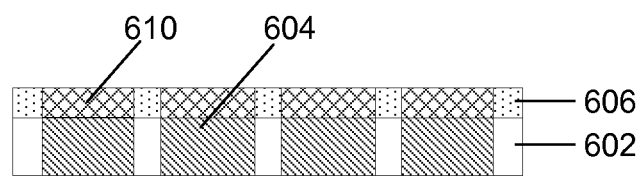

According to various embodiments, metal may be deposited into contact holes 608 for forming contacts 610, as illustrated in FIG. 6B. Metal contacts 610 may be formed using any material suitable for the purpose. For example, the metal may be a selected one or more of copper, platinum, aluminum, and the like. Other materials may be similarly suitable.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   forming a photoresist material over a dielectric layer;
   exposing a first pattern of the photoresist material to a first energy, wherein the first energy is less than a threshold energy;
   exposing a second pattern of the photoresist material to a second energy, wherein the second energy is less than the threshold energy, wherein the first energy combined with the second energy have a total energy equal to or greater than the threshold energy, and wherein the second pattern overlaps the first pattern at a plurality of locations; and
   developing the photoresist material, wherein while developing the photoresist material, the photoresist material at the plurality of locations is removed based on (i) the plurality of locations having been exposed to both the first energy and the second energy and (ii) the first energy combined with the second energy having a total energy equal to or greater than the threshold energy.

2. The method of claim 1, wherein:
   removing the photoresist material at the plurality of locations reveals portions of the dielectric layer; and
   the method further comprises
   etching the revealed portions of the dielectric layer to form a plurality of contact holes.

3. The method of claim 2, further comprising:
   depositing a metal in the plurality of contact holes to form a corresponding plurality of contacts.

4. The method of claim 3, further comprising:
   forming the dielectric layer over a substrate, wherein (i) the substrate forms a memory device including a plurality of memory cells and (ii) the plurality of contact holes are formed over the memory cells.

5. The method of claim 1, wherein the threshold energy is substantially equal to an activation energy dose that results in development of the photoresist material.

6. The method of claim 5, wherein the first energy and the second energy are each equal to or greater than half of the activation energy dose that results in development of the photoresist material.

7. The method of claim 1, wherein while developing the photoresist material, sections of the photoresist material, which are exposed to only one or none of the first energy or the second energy, are not removed.

8. The method of claim 1, wherein exposing the first pattern comprises exposing the photoresist material using a first mask configured to form the first pattern.

9. The method of claim 8, wherein exposing the second pattern comprises exposing the photoresist material using a second mask configured to form the second pattern.

10. The method of claim 8, wherein exposing the second pattern comprises re-positioning the first mask over the photoresist material for exposing the second pattern.

11. A method comprising:
    forming a photoresist material over a dielectric layer;
    exposing a plurality of patterns of the photoresist material to a corresponding plurality of energies, such that each pattern of the plurality of patterns of the photoresist material is exposed to a corresponding energy of plurality of energies, wherein each energy of the plurality of energies is less than a threshold energy, wherein a combination of the plurality of energies is equal to or greater than the threshold energy, and wherein the plurality of patterns overlap at a plurality of locations of the photoresist material; and
    developing the photoresist material, wherein while developing the photoresist material, the photoresist material at the plurality of locations is removed based on (i) the plurality of locations having been exposed to each of the plurality of energies and (ii) the combination of the plurality of energies being equal to or greater than the threshold energy.

12. The method of claim 11, wherein:
    removing the photoresist material at the plurality of locations reveals portions of the dielectric layer; and
    the method further comprises
    etching the revealed portions of the dielectric layer to form a plurality of contact holes.

13. The method of claim 12, further comprising:
    depositing a metal in the plurality of contact holes to form a corresponding plurality of contacts.

14. The method of claim 13, further comprising:
    forming the dielectric layer over a substrate, wherein (i) the substrate forms a memory device including a plurality of memory cells and (ii) the plurality of contact holes are formed over the memory cells.

15. The method of claim 11, wherein the threshold energy is substantially equal to an activation energy dose that results in development of the photoresist material.

16. The method of claim 11, wherein while developing the photoresist material, sections of the photoresist material, which are not exposed to each of the plurality of energies, are not removed.

17. The method of claim 11, wherein exposing the plurality of patterns of the photoresist material comprises:
    exposing the photoresist material to a first pattern of the plurality of patterns using a first mask configured to form the first pattern.

18. The method of claim 17, wherein exposing the plurality of patterns of the photoresist material further comprises:

exposing the photoresist material to a second pattern of the plurality of patterns using a second mask configured to form the second pattern.

19. The method of claim 17, wherein exposing the plurality of patterns of the photoresist material further comprises:

exposing the photoresist material to a second pattern of the plurality of patterns by re-positioning the first mask over the photoresist material for exposing the second pattern.

20. The method of claim 11, wherein the plurality of patterns comprises at least a first pattern, a second pattern and a third pattern.

* * * * *